United States Patent
Iwayama

(10) Patent No.: US 12,160,997 B2
(45) Date of Patent: Dec. 3, 2024

(54) MAGNETIC MEMORY DEVICE

(71) Applicant: Kioxia Corporation, Tokyo (JP)

(72) Inventor: Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 392 days.

(21) Appl. No.: 17/692,785

(22) Filed: Mar. 11, 2022

(65) Prior Publication Data

US 2023/0081718 A1    Mar. 16, 2023

(30) Foreign Application Priority Data

Sep. 16, 2021    (JP) ................. 2021-151512

(51) Int. Cl.
| | |
|---|---|
| *H10B 61/00* | (2023.01) |
| *G11C 11/16* | (2006.01) |
| *H10N 50/01* | (2023.01) |
| *H10N 50/80* | (2023.01) |

(52) U.S. Cl.
CPC ............ *H10B 61/00* (2023.02); *G11C 11/161* (2013.01); *H10N 50/80* (2023.02); *G11C 11/1673* (2013.01); *G11C 11/1675* (2013.01); *H10N 50/01* (2023.02)

(58) Field of Classification Search
None
See application file for complete search history.

(56) References Cited

U.S. PATENT DOCUMENTS

| | | | |
|---|---|---|---|
| 7,539,040 B2 | 5/2009 | Tamai et al. | |
| 8,432,720 B2* | 4/2013 | Awaya | H10B 63/84 |
| | | | 365/175 |
| 10,559,624 B2 | 2/2020 | Yang et al. | |
| 10,943,632 B2 | 3/2021 | Furuhashi | |
| 2020/0303454 A1* | 9/2020 | Furuhashi | G11C 11/1675 |

FOREIGN PATENT DOCUMENTS

| | | |
|---|---|---|
| JP | 4251576 B2 | 1/2009 |
| JP | 2020155441 A | 9/2020 |

* cited by examiner

*Primary Examiner* — Bo B Jang
(74) *Attorney, Agent, or Firm* — Holtz, Holtz & Volek PC

(57) ABSTRACT

According to one embodiment, a magnetic memory device includes a memory cell including a magnetoresistance effect element, a switching element, and a resistance element connected in series. The resistance element has an asymmetric current-voltage characteristic, and when data is read from the memory cell, a first voltage in a reverse direction is applied to the resistance element, and a resistance value of the resistance element at a time when the first voltage is applied is greater than a resistance value of the resistance element at a time when a second voltage in a forward direction having an absolute value identical to an absolute value of the first voltage is applied.

13 Claims, 17 Drawing Sheets

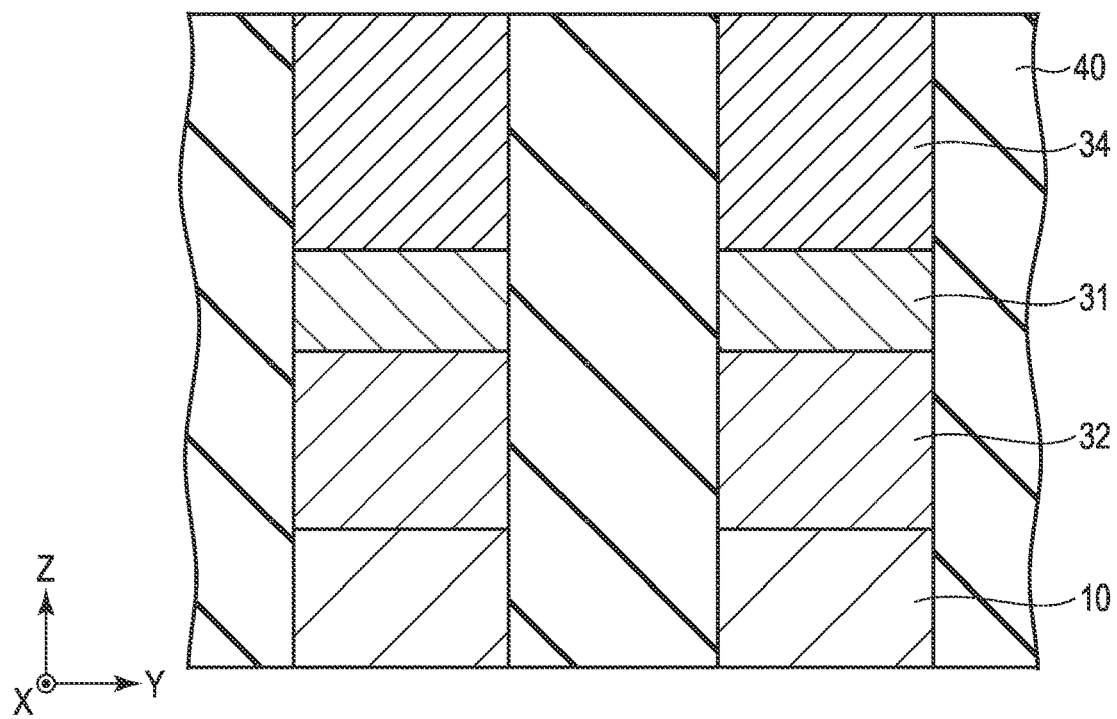
F I G. 16A
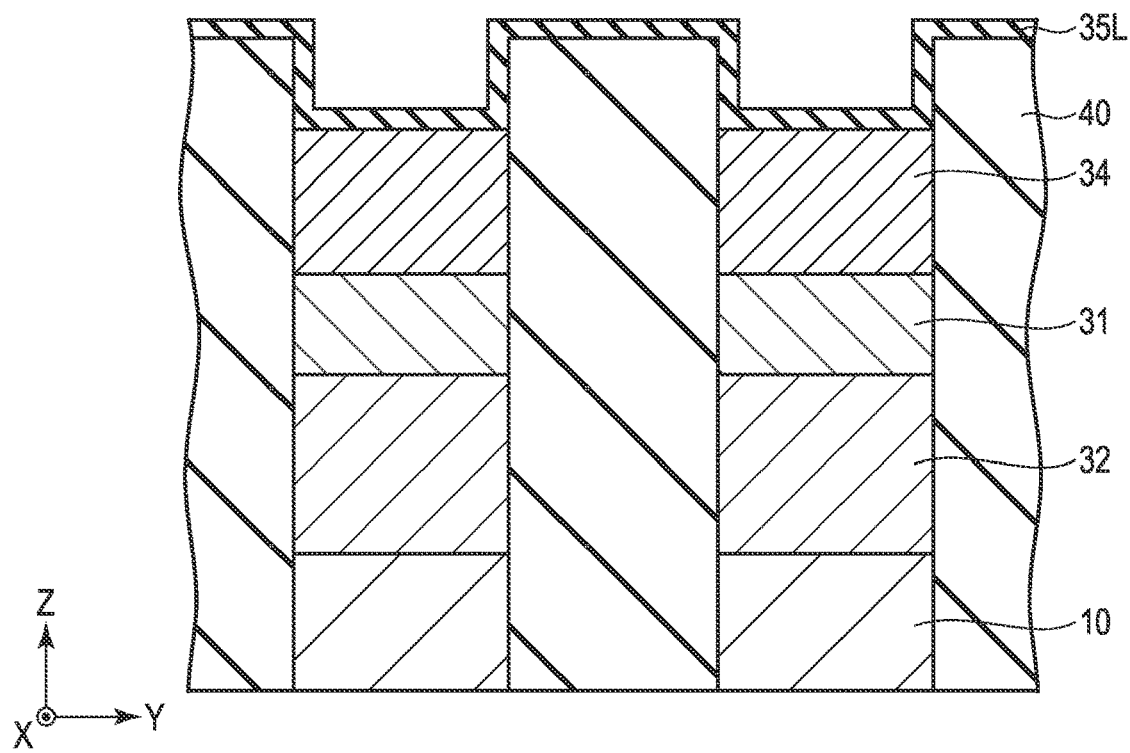
F I G. 16B ptсуп# MAGNETIC MEMORY DEVICE

CROSS-REFERENCE TO RELATED APPLICATIONS

This application is based upon and claims the benefit of priority from Japanese Patent Application No. 2021-151512, filed Sep. 16, 2021, the entire contents of which are incorporated herein by reference.

FIELD

Embodiments described herein relate generally to a magnetic memory device.

BACKGROUND

A magnetic memory device in which magnetoresistance effect elements and selectors (switching elements) are integrated on a semiconductor substrate is now proposed.

BRIEF DESCRIPTION OF THE DRAWINGS

FIG. 6 is a view schematically showing the current-voltage characteristic of the memory cell according to the first embodiment.

Figure 1:
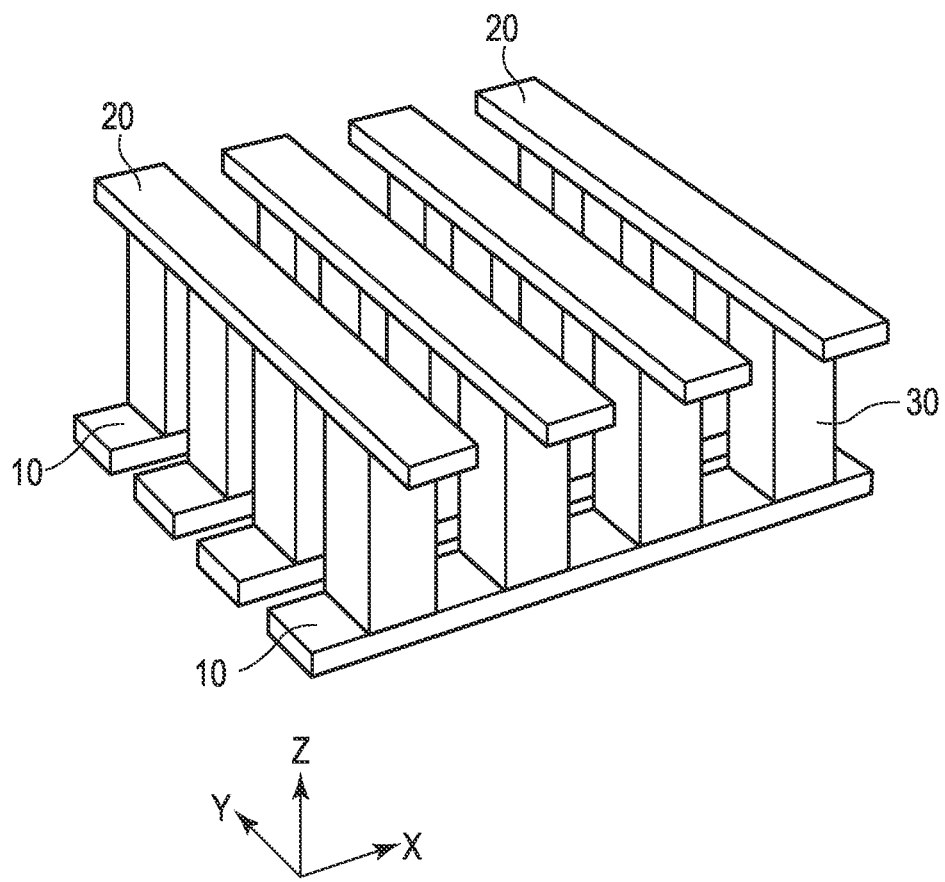
FIG. 1 is a perspective view schematically showing the configuration of a magnetic memory device according to a first embodiment.
Figure 10A:
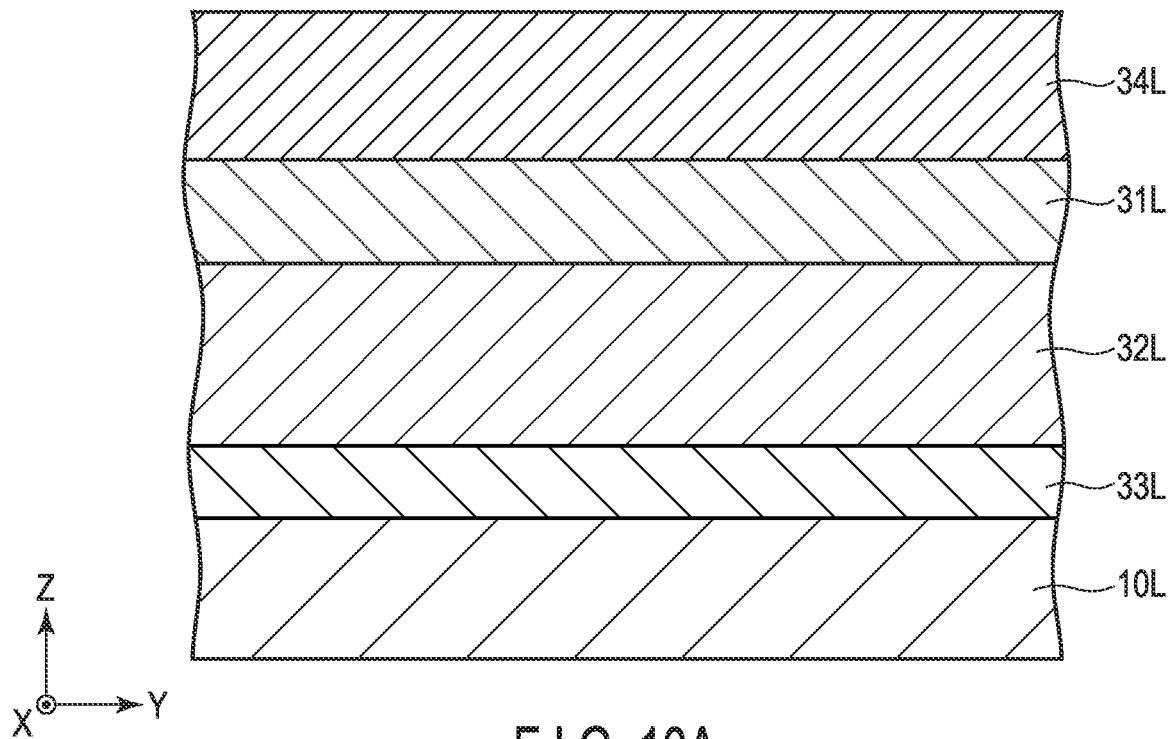
Figure 10B:
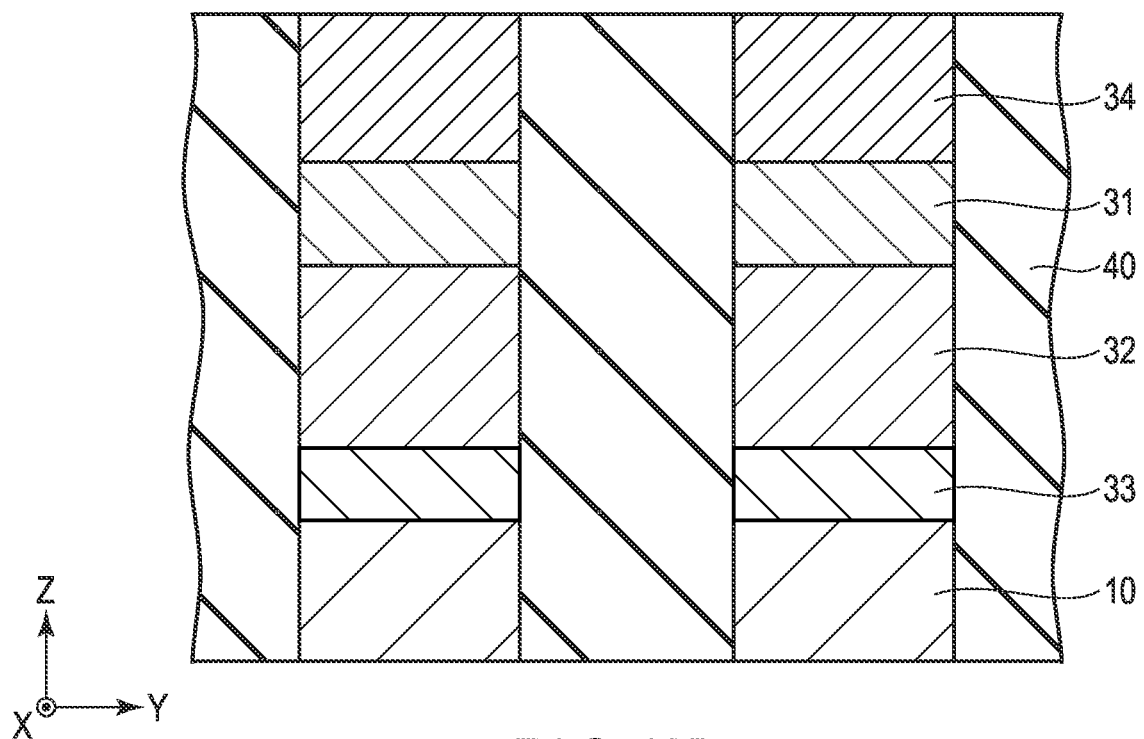

Each of FIG. 10A, FIG. 10B, and FIG. 1.0 is a cross-sectional view schematically showing a manufacturing method of the magnetic memory device according to the first embodiment.

Figure 11:
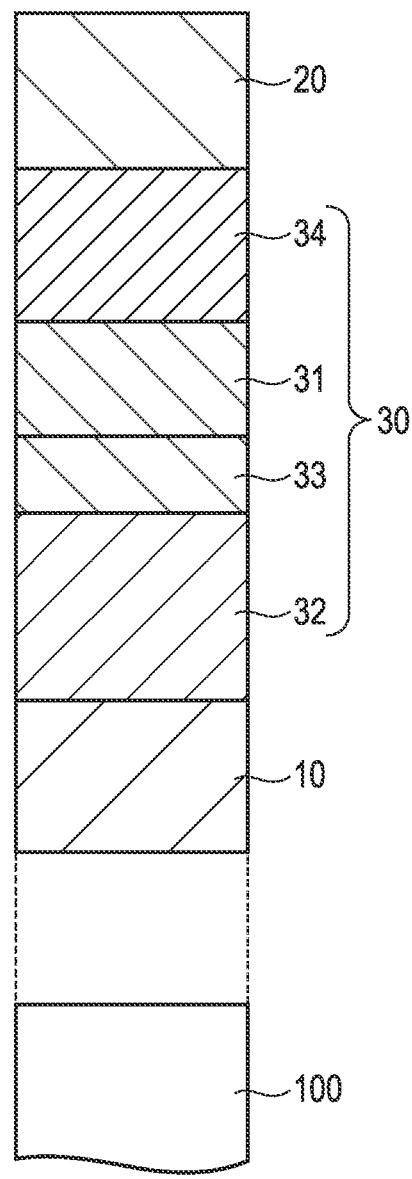

FIG. 11 is a cross-sectional view schematically showing the configurations of first wiring, second wiring, and a memory cell according to a first modified example of the first embodiment.

Figure 12:
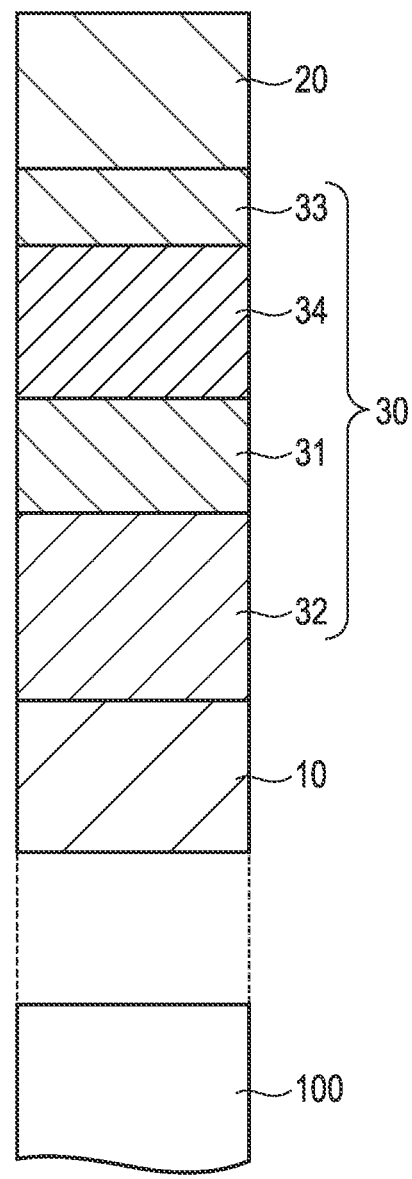

FIG. 12 is a cross-sectional view schematically showing the configurations of first wiring, second wiring, and a memory cell according to a second modified example of the first embodiment.

Figure 13:
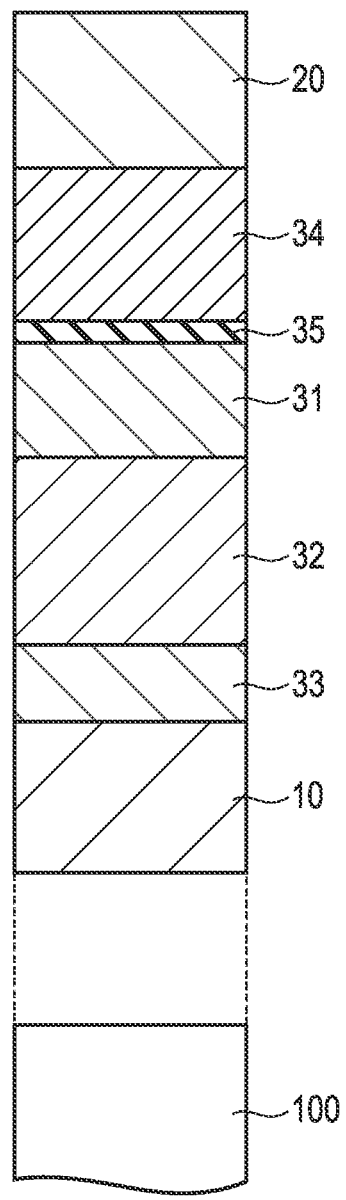

FIG. 13 is a cross-sectional view schematically showing the configurations of first wiring, second wiring, and a memory cell according to a second embodiment.

Figure 14:
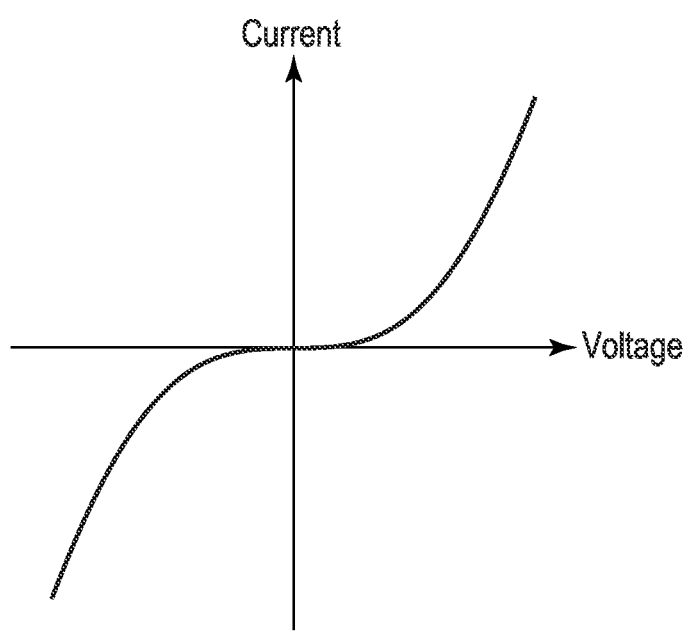

FIG. 14 is a view schematically showing the current-voltage characteristic of a tunnel barrier element according to the second embodiment.

Figure 15:
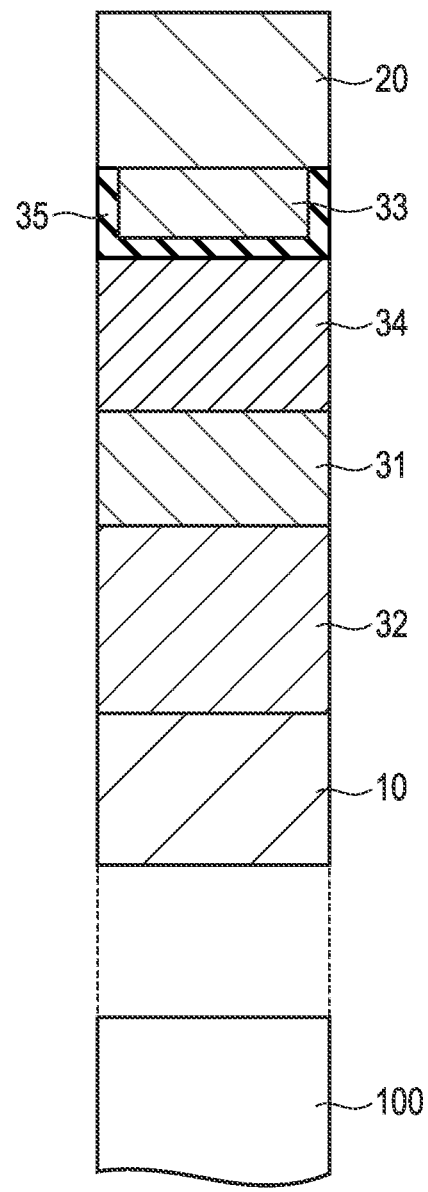

FIG. 15 is a cross-sectional view schematically showing the configurations of first wiring, second wiring, and a memory cell according to a modified example of the second embodiment.

Each of FIG. 16A, FIG. 16B, FIG. 16C, and FIG. 16D is a cross-sectional view schematically showing a manufacturing method of a magnetic memory device according to the second embodiment.

Figure 17:
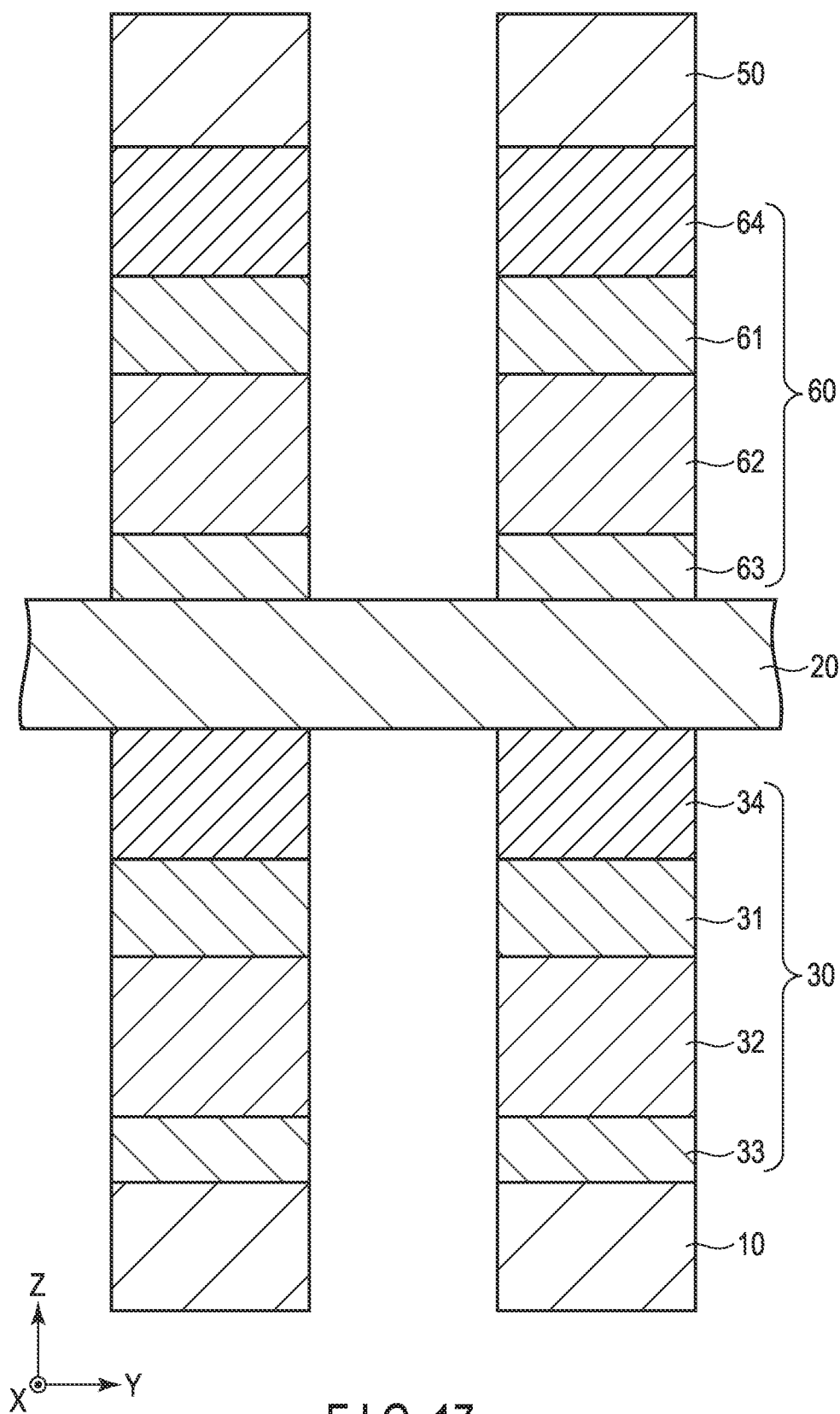

FIG. 17 is a cross-sectional view schematically showing the configuration of a magnetic memory device according a third embodiment.

Figure 18:
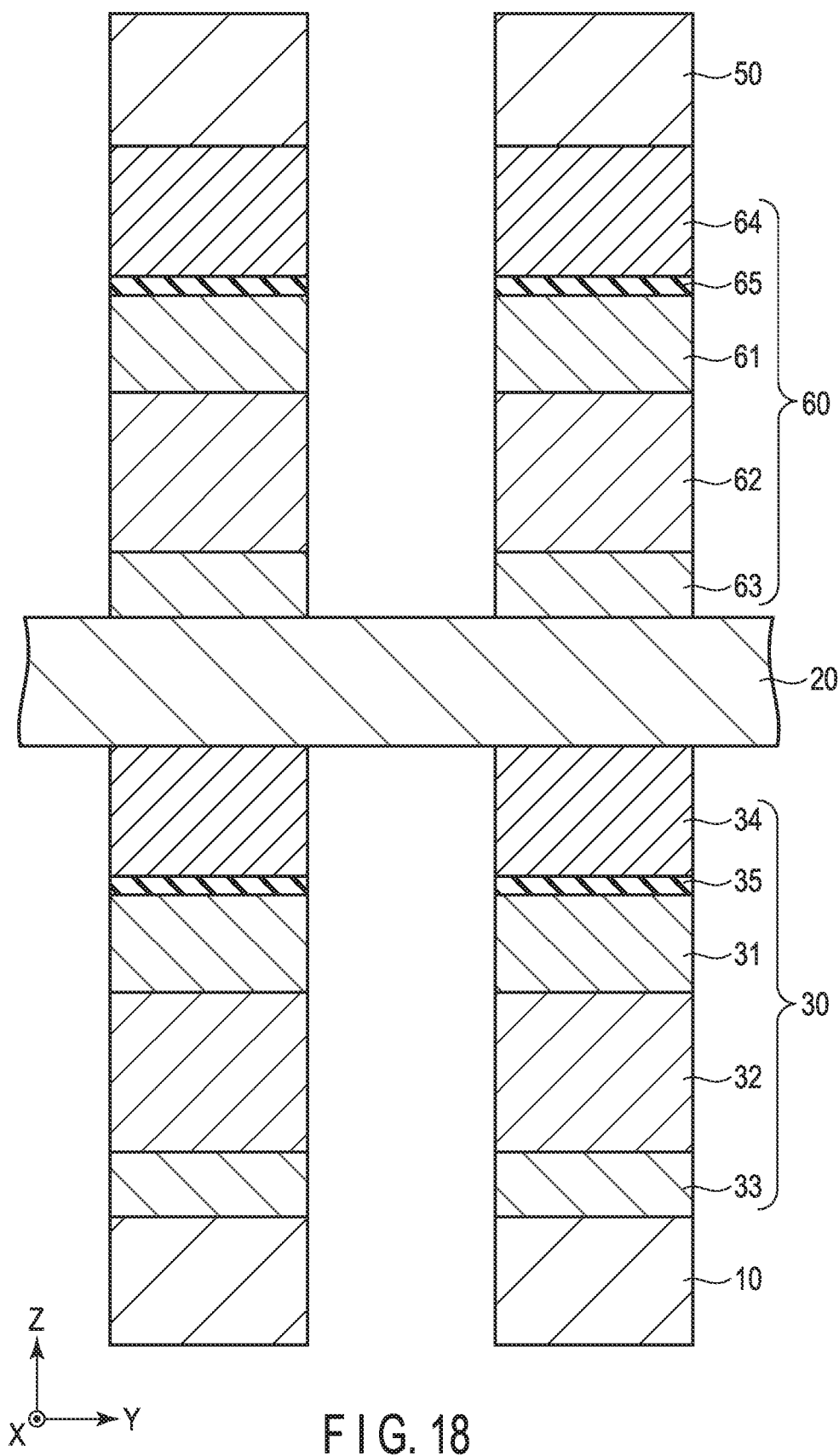

FIG. 18 is a cross-sectional view schematically showing the configuration of a magnetic memory device according to a modified example of the third embodiment.

DETAILED DESCRIPTION

In general, according to one embodiment, a magnetic memory device includes: a first wiring extending in a first direction; a second wiring extending in a second direction intersecting the first direction; and a first memory cell connected between the first wiring and the second wiring, including a first magnetoresistance effect element having a low resistance state and a high resistance state, a first switching element, and a first resistance element which are connected in series, and storing data corresponding to a resistance state of the first magnetoresistance effect element, wherein the first resistance element has a current-voltage characteristic asymmetric with respect to a case where a voltage in a forward direction is applied thereto and a case where a voltage in a reverse direction is applied thereto, and when data corresponding to the resistance state of the first magnetoresistance effect element is read from the first memory cell, a first voltage in the reverse direction is applied to the first resistance element, and a resistance value of the first resistance element at a time when the first voltage in the reverse direction is applied thereto is greater than a resistance value of the first resistance element at a time when a second voltage in the forward direction having an absolute value identical to an absolute value of the first voltage is applied thereto.

Embodiments will be described hereinafter with reference to the accompanying drawings.

First Embodiment

FIG. 1 is a perspective view schematically showing the configuration of a magnetic memory device according to a first embodiment.

As shown in FIG. 1, the magnetic memory device includes first wiring 10 extending in an X-direction (first direction), second wiring 20 extending in a Y-direction (second direction), and a memory cell 30 connected between the first wiring 10 and second wiring 20. One of the first wiring 10 and second wiring 20 corresponds to a word line and the other corresponds to a bit line. It should be noted that the X-direction, Y-direction, and Z-direction are directions intersecting each other. More specifically, the X-direction, Y-direction, and Z-direction are directions orthogonal to each other.

Figure 2:
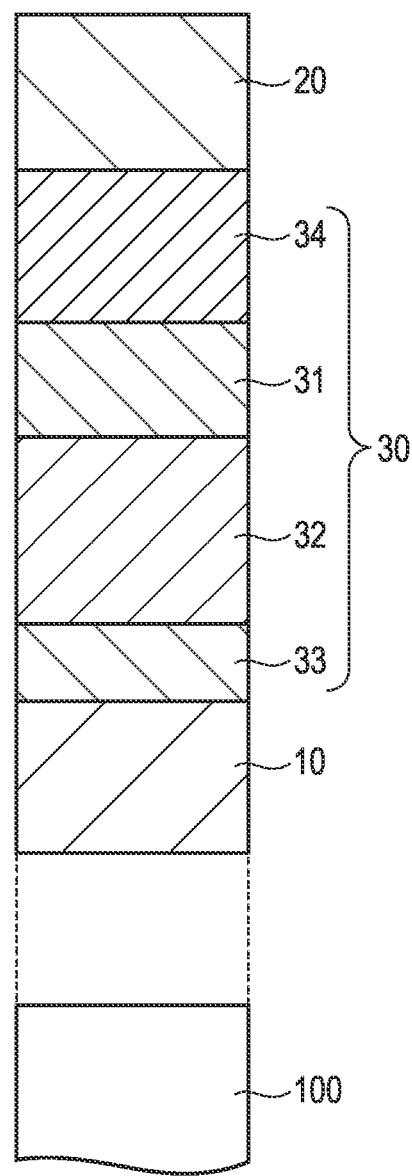
FIG. 2 is a cross-sectional view schematically showing the configurations of first wiring, second wiring, and a memory cell according to the first embodiment.

FIG. 2 is a cross-sectional view schematically showing the configurations of the first wiring 10, second wiring 20, and a memory cell 30.

As shown in FIG. 2, the first wiring 10, second wiring 20, and memory cell 30 are provided above a semiconductor substrate 100.

The memory cell 30 is connected between the first wiring 10 and second wiring 20, includes a magnetoresistance effect element 31, selector (switching element) 32, resistance element 33, and top electrode 34, and stores therein data corresponding to the resistance state of the magnetoresistance effect element 31. As can be seen from FIG. 2, the magnetoresistance effect element 31, selector 32, and resistance element 33 are connected in series. In the example shown in FIG. 2, the selector 32 and resistance element 33 are adjacent to each other, and selector 32 is provided between the magnetoresistance effect element 31 and resistance element 33.

Figure 3:
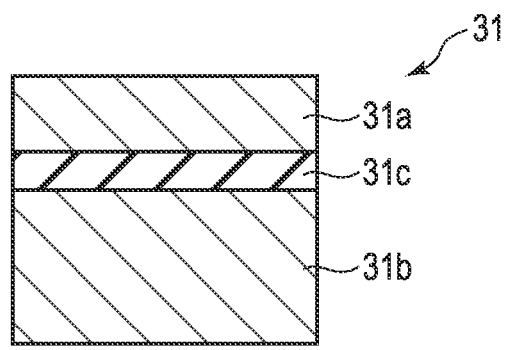
FIG. 3 is a cross-sectional view schematically showing the configuration of a magnetoresistance effect element according to the first embodiment.

FIG. 3 is a cross-sectional view schematically showing the configuration of the magnetoresistance effect element 31.

The magnetoresistance effect element 31 is a magnetic tunnel junction (MTJ) element and includes a storage layer (first magnetic layer) 31a, reference layer (second magnetic layer) 31b, and tunnel barrier layer (nonmagnetic layer) 31c.

The storage layer 31a is a ferromagnetic layer having a variable magnetization direction. The variable magnetization direction implies a magnetization direction variable with respect to a predetermined write current. The reference layer 31t is a ferromagnetic layer having a fixed magnetization direction. The fixed magnetization direction implies a magnetization direction invariable with respect to the predetermined write current. The tunnel barrier layer 31c is an insulating layer provided between the storage layer 31a and reference layer 31b.

The magnetoresistance effect element 31 is a spin transfer torque (STT) magnetoresistance effect element and has perpendicular magnetization. That is, the magnetization direction of the storage layer 31a is perpendicular to the film surface thereof and magnetization direction of the reference layer 31b is perpendicular to the film surface thereof.

The magnetoresistance effect element 31 may further include a shift canceling layer configured to cancel a magnetic field to be applied from the reference layer 31b to the storage layer 31a.

When the magnetization direction of the storage layer 31a is parallel to the magnetization direction of the reference layer 31b, the magnetoresistance effect element 31 is in a relatively low resistance state. When the magnetization direction of the storage layer 31a is antiparallel to the magnetization direction of the reference layer 31b, the magnetoresistance effect element 31 is in a relatively high resistance state. Accordingly, the magnetoresistance effect element 31 can store therein binary data according to the resistance state thereof. Further, a resistance state can be set to the magnetoresistance effect element 31 according to the direction of a current flowing through the magnetoresistance effect element 31.

Further, in this embodiment, the direction of a current flowing through the magnetoresistance effect element 31 when data corresponding to the resistance state of the magnetoresistance effect element 31 is read from the memory cell 30 is identical to the direction of a current flowing through the magnetoresistance effect element 31 when the low resistance state is set to the magnetoresistance effect element 33.

Figure 4A:
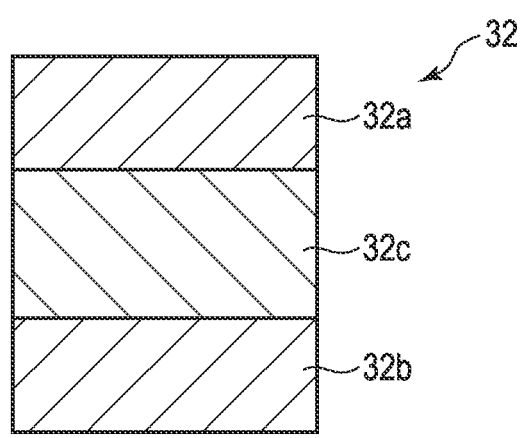
FIG. 4A is a cross-sectional view schematically showing the configuration of a selector according to the first embodiment.

FIG. 4A is a cross-sectional view schematically showing the configuration of the selector 32.

The selector 32 is a two-terminal switching element having a nonlinear current-voltage characteristic and includes a top electrode 32a, bottom electrode 32b, and selector material layer 32c provided between the top electrode 32a and bottom electrode 32b.

Figure 4B:
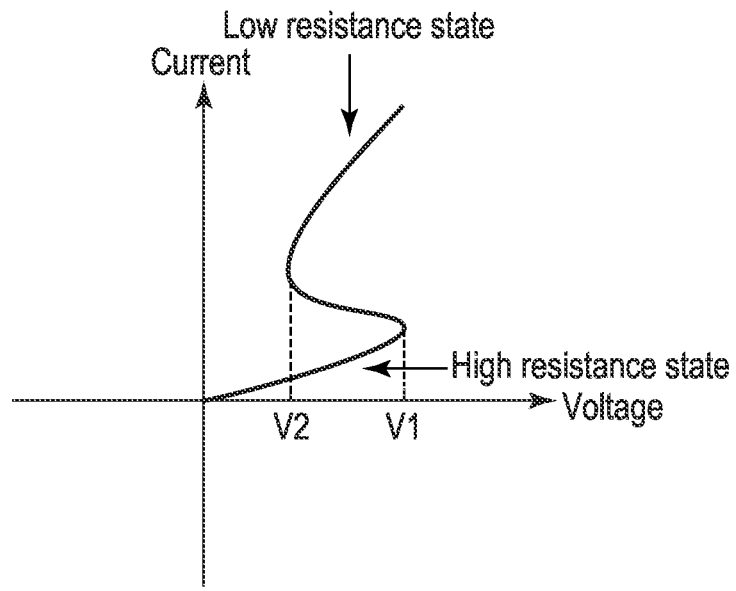
FIG. 4B is a view schematically showing the characteristic of the selector according to the first embodiment.

It should be noted that in this embodiment, as the selector 32, a switching element having the characteristic that the resistance value thereof abruptly lowers at a voltage V1, then concomitantly with this, applied voltage abruptly lowers to a voltage V2, and current increases (snaps back) as shown in FIG. 4B will be described as an example. The material and composition to be used for the switching element having such a characteristic are appropriately selected according to the characteristic of the memory cell.

Figure 5:
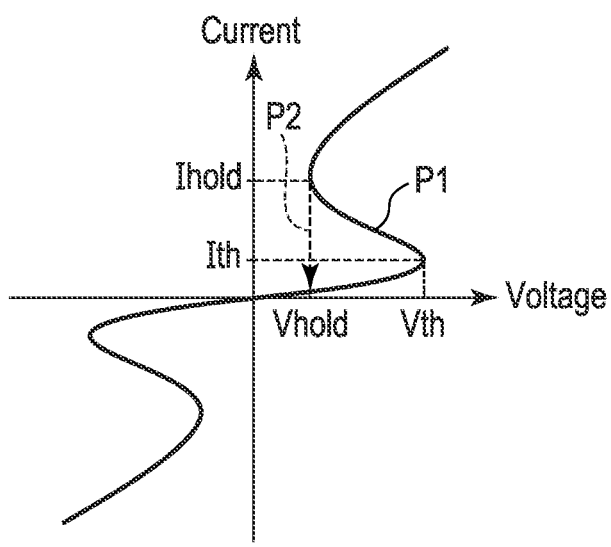
FIG. 5 is a view schematically showing the current-voltage characteristic of the selector according to the first embodiment.

FIG. 5 is a view schematically showing the current-voltage characteristic of the selector 32 based on a current sweep of the selector 32.

As shown in FIG. 5, the selector 32 has the characteristic that when the current to be applied between the two terminals thereof increases to reach a threshold current Ith, the selector 32 makes a transition from the off-state to the on-state and, when the voltage to be applied between the two terminals thereof decreases to reach a hold voltage Vhold lower than a threshold voltage Vth, the selector 32 makes a transition from the on-state to the off-state. That is, when the current to be applied between the two terminals thereof decreases to reach the hold current Ihold, the selector 32 makes a transition to the off-state by way of the path P2 without following the path P1. Further, as shown in FIG. 5, the selector 32 has the current-voltage characteristic having point symmetry with respect to the positive direction and negative direction. Further, the hold current of the selector 32 has a correlation with the external resistance in the vicinity thereof and, when the external resistance becomes higher, the hold current can be lowered.

Figure 6:
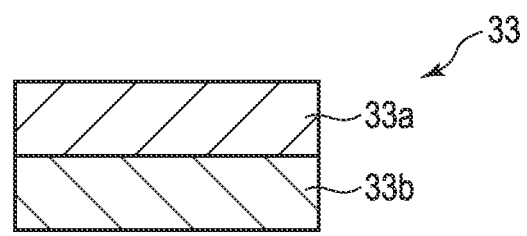
FIG. 6 is a cross-sectional view schematically showing the configuration of a resistance element according to the first embodiment.

FIG. 6 is a cross-sectional view schematically showing the configuration of the resistance element 33.

As the resistance element 33, a pn junction diode formed of a semiconductor layer 33a and semiconductor layer 33b is used. One of the semiconductor layer 33a and semiconductor layer 33b is a p-type semiconductor layer and the other is an n-type semiconductor layer. The semiconductor layer 33a and semiconductor layer 33b are each formed of polysilicon.

Figure 7:
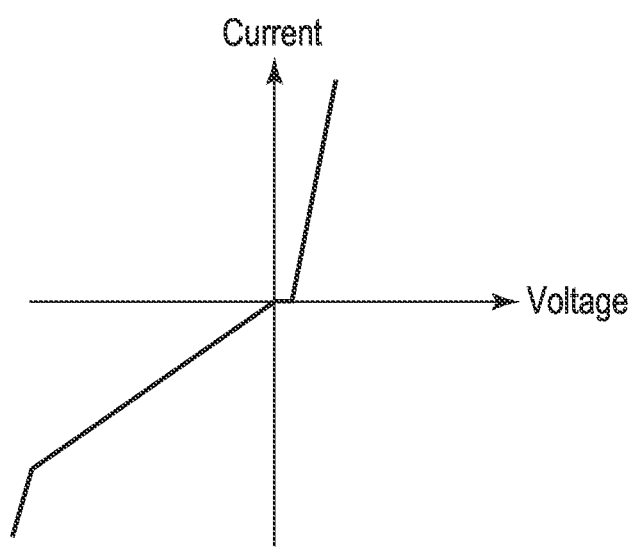
FIG. 7 is a view schematically showing the current-voltage characteristic of the resistance element according to the first embodiment.

FIG. 7 is a view schematically showing the current-voltage characteristic of the resistance element 33.

The resistance element 33 is a pn junction diode and has the current-voltage characteristic asymmetric with respect to the case where a voltage in the forward direction is applied thereto and case where a voltage in the reverse direction is applied thereto. However, the resistance element (pn junction diode) 33 of this embodiment is formed by using polysilicon and has no excellent reverse characteristic as compared with an ideal pn junction diode. That is, in the pn junction diode of this embodiment, the resistance value in the reverse direction is lower as compared with the ideal pn junction diode.

Further, when data is read from the memory cell 30, a reverse voltage is applied to the resistance element (pn junction diode) 33 and reverse current flows through the resistance element 33.

As described above, the memory cell 30 of this embodiment has the configuration in which the magnetoresistance effect element 31, selector 32, and resistance element 33 are connected in series. By virtue of such a configuration, in this embodiment, it is possible to obtain a magnetic memory device capable of suppression of read disturb and reduction in power consumption and capable of carrying out an appropriate read operation. Hereinafter, descriptions of the magnetic memory device will be given.

Figure 8:
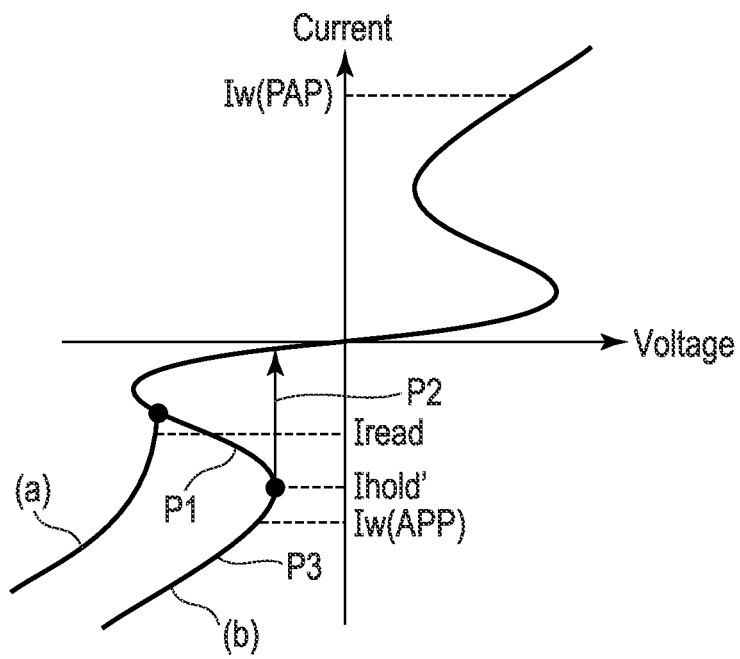

FIG. 8 is a view schematically showing the current-voltage characteristic (a) of the memory cell 30 of a case where the memory cell 30 is constituted of a series connection of the magnetoresistance effect element 31, selector 32, and resistance element 33, and current-voltage characteristic (b) of the memory cell 30 of a case (case where the resistance element 33 is not included) where the memory cell 30 is constituted of a series connection of the magnetoresistance effect element 31 and selector 32.

Figure 9:
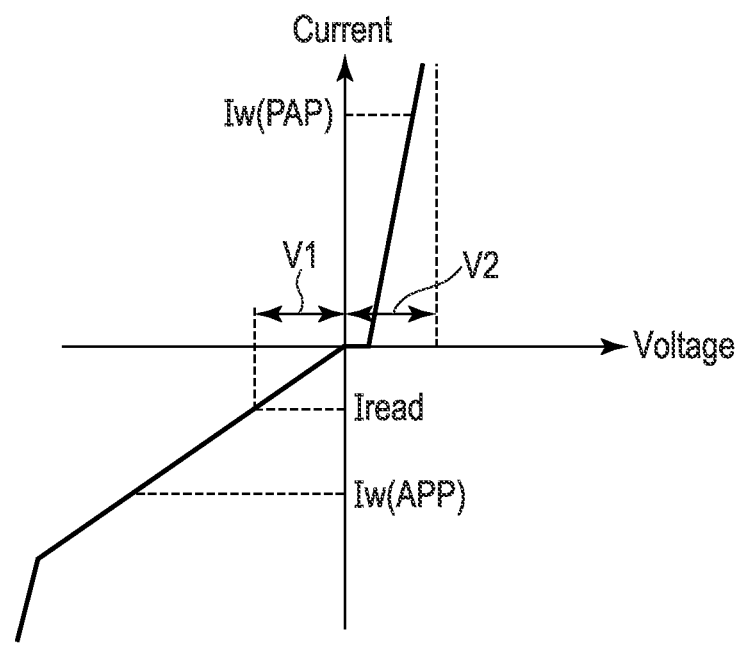
FIG. 9 is a view schematically showing a voltage to be applied to the resistance element and current flowing through the resistance element when read/write from/to the memory cell is carried out according to the first embodiment.

FIG. 9 is a view schematically showing a voltage to be applied to the resistance element 33 and current flowing through the resistance element 33 when read/write from/to the memory cell 30 is carried out, the above being basically identical to the current-voltage characteristic shown in FIG. 7.

In FIG. 8 and FIG. 9, Iw (PAP) indicates a write current to be applied to the memory cell 30 at the time when the state of the magnetoresistance effect element 31 is changed from the parallel state (low resistance state where the magnetization direction of the storage layer 31a is parallel to the magnetization direction of the reference layer 31b) to the antiparallel state (high resistance state where the magnetization direction of the storage layer 31a is antiparallel to the magnetization direction of the reference layer 31b). Iw (APP) indicates a write current to be applied to the memory cell 30 at the time when the state of the magnetoresistance effect element 31 is changed from the antiparallel state to the parallel state. Iread indicates the minimum value of a read current required when data based on the resistance state set to the magnetoresistance effect element 31 is read from the memory cell 30.

The resistance element 33 has the diode characteristic. For this reason, in the operating range at the time when read and write from and to the memory cell 30 are carried out, the reverse resistance of the resistance element 33 is greater than the forward resistance thereof. That is, as shown in FIG. 9, the reverse voltage applied to the resistance element 33 when data corresponding to the resistance state of the magnetoresistance effect element 31 is read from the memory cell 30 is named as a first voltage V1, then the resistance value of the resistance element 33 at the time when the first voltage V1 is applied to the resistance element 33 is greater than the resistance value of the resistance element 33 at the time when a second forward voltage V2 having an absolute value identical to the absolute value of the first voltage V1 is applied to the resistance element 33.

Further, the resistance value of the resistance element 33 at the time when the first voltage V1 is applied thereto is less than the resistance value of the magnetoresistance effect element 31 in the low resistance state. Further, the resistance value of the resistance element 33 at the time when the first voltage V3 is applied thereto is greater than the resistance value of the selector 32 in the on-state and is less than the resistance value of the selector 32 in the off-state.

As shown in FIG. 8, the current-voltage characteristic of the memory cell 30 has the characteristic in which the current-voltage characteristic of the selector 32 shown in FIG. 5 is strongly reflected. As can be seen from FIG. 9, the forward resistance of the resistance element 33 is sufficiently less than the reverse resistance thereof and is also sufficiently smaller even when compared with the total of the resistance values of the resistance (resistance in the low resistance state, resistance in the high resistance state) of the magnetoresistance effect element 31 and on-resistance of the selector 32. Accordingly, in the positive region of FIG. 8, i.e., in the region in which the resistance element 33 operates in the forward direction, the characteristic (a) of the memory cell 30 of the case where the resistance element 33 is included in the memory cell 30 and characteristic (b) of the memory cell 30 of the case where the resistance element 33 is not included in the memory cell 30 are substantially identical to each other.

On the other hand, in the negative region of FIG. 8, i.e., in the region in which the resistance element 33 operates in the reverse direction, the reverse resistance of the resistance element 33 has a value not negligible as compared with the total of the resistance values of the resistance (resistance in the low resistance state, resistance in the high resistance state) of the magnetoresistance effect element 31 and on-resistance of the selector 32. Accordingly, in the negative region of FIG. 8, the characteristic (a) of the memory cell 30 of the case where the resistance element 33 is included in the memory cell 30 is largely different from the characteristic (b) of the memory cell 30 of the case where the resistance element 33 is not included in the memory cell 30.

First, consideration is given to the case (case of FIG. 8 (b)) where the resistance element 33 is not included in the memory cell 30. In FIG. 4, when the voltage applied to the memory cell 30 decreases to make the current less than the current Ihold', the current-voltage characteristic follows the path P2 without following the path P1. Accordingly, it is not possible to set the read current to the minimum value Iread, and it is necessary to set the read current in the region of the path P3. As a result, an increase in the read current and occurrence of read disturb are caused.

On the other hand, in the case (case of FIG. 8 (a)) where the resistance element 33 is included in the memory cell 30, it is possible to set the read current to the minimum value Iread. Accordingly, in this embodiment, it is possible to reduce the read current and suppress occurrence of read disturb.

Further, in this embodiment, the resistance element 33 has the diode characteristic. Assuming that the resistance element 33 has no diode characteristic and has the current-voltage characteristic unchanged with respect to the positive direction and negative direction, the resistance value of the series circuit of the memory cell 30 becomes higher in both the write operation in the positive direction (write operation to be carried out to set the magnetoresistance effect element 31 to the high resistance state) and write operation in the negative direction (write operation to be carried out to set the magnetoresistance effect element 31 to the low resistance state) and thus an increase in the power consumption is caused. In this embodiment, it is possible to make the resistance value of the series circuit of the memory cell 30 lower in the write operation in the positive direction, and hence it is possible to suppress an increase in the power consumption.

As described above, in this embodiment, it is possible to suppress the read disturb and reduce the power consumption and it becomes possible to carry out an appropriate read operation.

Next, a manufacturing method of the magnetic memory device according to this embodiment will be described with reference to the cross-sectional views shown in FIGS. 10A to 10C.

First, as shown in FIG. 10A, a first wiring layer 10L, resistance element layer 33L, selector layer 32L, magnetoresistance effect element layer 31L, and top electrode layer 34L are formed.

Next, as shown in FIG. 10B, by subjecting the first wiring layer 10L, resistance element layer 33L, selector layer 32L, magnetoresistance effect element layer 31L, and top electrode layer 34L to patterning, a pattern of the first wiring 10, resistance elements 33, selectors 32, magnetoresistance effect elements 31, and top electrodes 34 is formed. Furthermore, interlayer insulating layers 40 are formed.

Figure 10C:
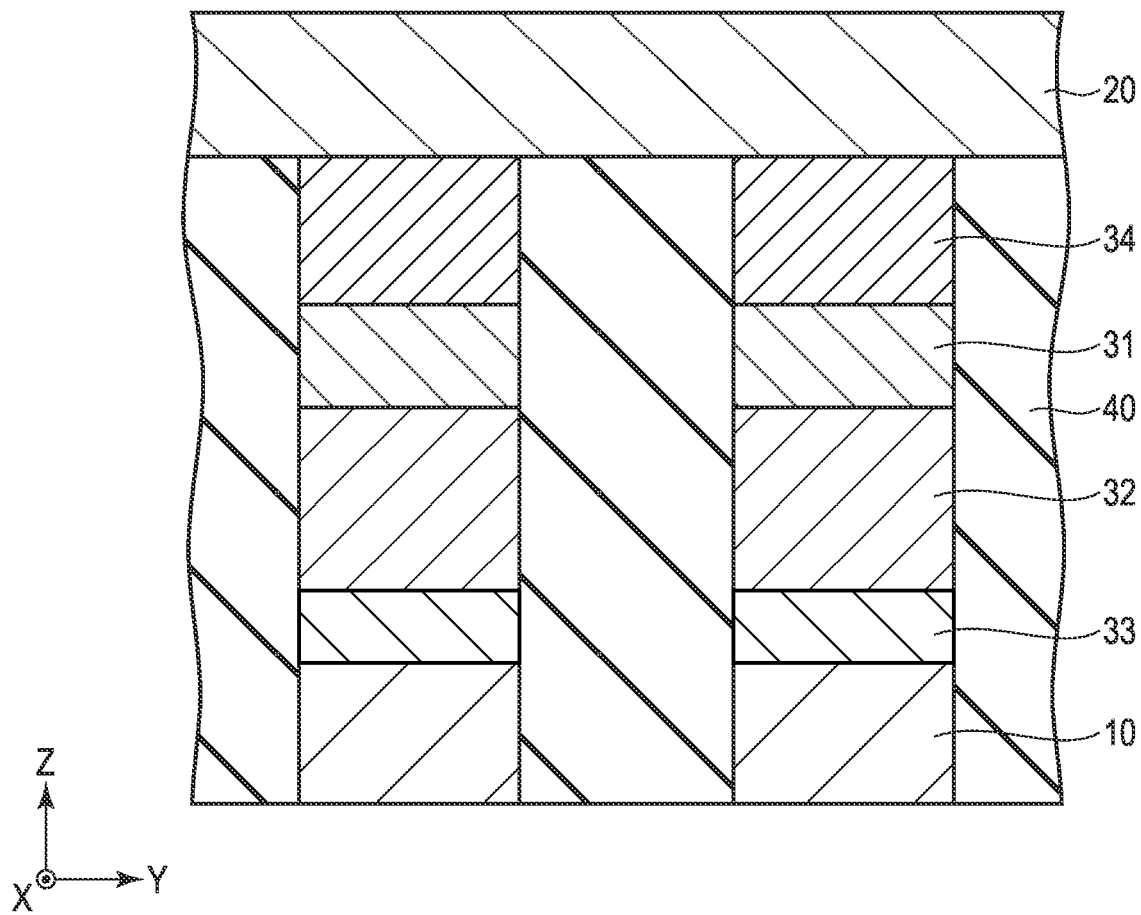

Next, as shown in FIG. 10C, a pattern of the second wiring 20 is formed on the structure obtained in the process of FIG. 108.

In the manner described above, a magnetic memory device including the first wiring 10, resistance elements 33, selectors 32, magnetoresistance effect elements 31, top electrodes 34, and second wiring 20 is obtained.

FIG. 11 is a cross-sectional view schematically showing the configurations of the first wiring 10, second wiring 20, and memory cell 30 according to a first modified example of this embodiment.

In this modified example too, the magnetoresistance effect element 31, selector 32, and resistance element 33 are connected in series, and selector 32 and resistance element 33 are adjacent to each other. Further, in this modified example, the resistance element 33 is provided between the magnetoresistance effect element 31 and selector 32.

FIG. 12 is a cross-sectional view schematically showing the configurations of the first wiring 10, second wiring 20, and memory cell 30 according to a second modified example of this embodiment.

In this modified example too, the magnetoresistance effect element 31, selector 32, and resistance element 33 are connected in series. However, in this modified example, the selector 32 and resistance element 33 are not adjacent to each other, and magnetoresistance effect element 31 is provided between the selector 32 and resistance element 33. Further, in this modified example, the resistance element 33 is provided between the second wiring 20 and top electrode 34.

In the first and second modified examples too, it is possible to obtain advantageous effects identical to the advantageous effects described in the aforementioned embodiment.

Second Embodiment

Next, a second embodiment will be described. It should be noted that the fundamental items are identical to the aforementioned first embodiment and descriptions of the items described in the first embodiment are omitted.

FIG. 13 is a cross-sectional view schematically showing the configurations of first wiring 10, second wiring 20, and a memory cell 30.

In this embodiment, the memory cell 30 further includes a tunnel barrier element 35, and magnetoresistance effect element 31, selector 32, resistance element 33, and tunnel barrier element 35 are connected in series. Although in the example shown in FIG. 13, the tunnel barrier element 35 is provided between the magnetoresistance effect element 31 and top electrode 34, the position of the tunnel barrier element 35 in the series connection of the memory cell is not particularly limited.

The tunnel barrier element 35 is formed of a tunnel barrier layer and has a nonlinear current-voltage characteristic. The tunnel barrier layer is formed of an insulating material such as silicon nitride, silicon oxide or the like.

FIG. 14 is a view schematically showing the current-voltage characteristic of the tunnel barrier element (tunnel barrier layer) 35. As shown in FIG. 14, the tunnel barrier element 35 has a current-voltage characteristic having point symmetry with respect to the positive direction and negative direction. Further, the tunnel barrier element 35 has a current-voltage characteristic that when the applied voltage is increased, the current thereof abruptly increases and, with an increase in the applied voltage, the resistance value thereof abruptly decreases.

In this embodiment, the tunnel barrier element 35 described above is further connected in series to the magnetoresistance effect element 31, selector 32, and resistance element 33, and hence it is possible to further increase the resistance value of the series connection at the time of read. Accordingly, it is possible to further reduce the read current and suppress the occurrence of read disturb and increase in the power consumption.

FIG. 15 is a cross-sectional view schematically showing the configurations of first wiring 10, second wiring 20, and a memory cell 30 according to a modified example of this embodiment.

In this modified example too, the magnetoresistance effect element 31, selector 32, resistance element 33, and tunnel barrier element 35 are connected in series. Further, in this modified example, the resistance element 33 is provided between the second wiring 20 and top electrode 34, and tunnel barrier element 35 is provided between the resistance element 33 and top electrode 34.

In this modified example too, by providing the tunnel barrier element 35, it is possible to obtain the advantageous effects identical to the aforementioned embodiment.

Next, a manufacturing method of the magnetic memory device according to this modified example will be described with reference to the cross-sectional views shown in FIGS. 16A to 16D.

First, as shown in FIG. 16A, a pattern of the first wiring 10, selector 32, magnetoresistance effect element 31, and top electrode 34 is formed. Furthermore, interlayer insulating layers 40 are formed.

Next, as shown in FIG. 16B, the top electrodes 34 are recessed, and a silicon nitride layer is formed as a tunnel barrier layer 35L along the recessed surfaces of the top electrodes 34 and surfaces of the interlayer insulating layers 40.

Figure 16C:
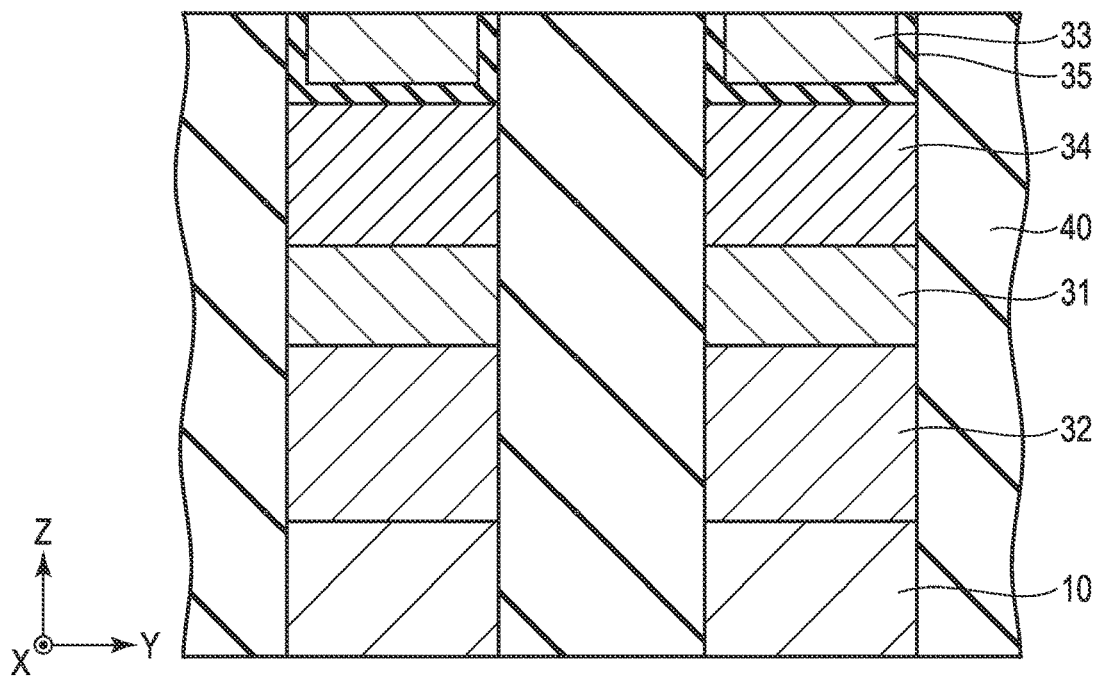
Figure 16D:
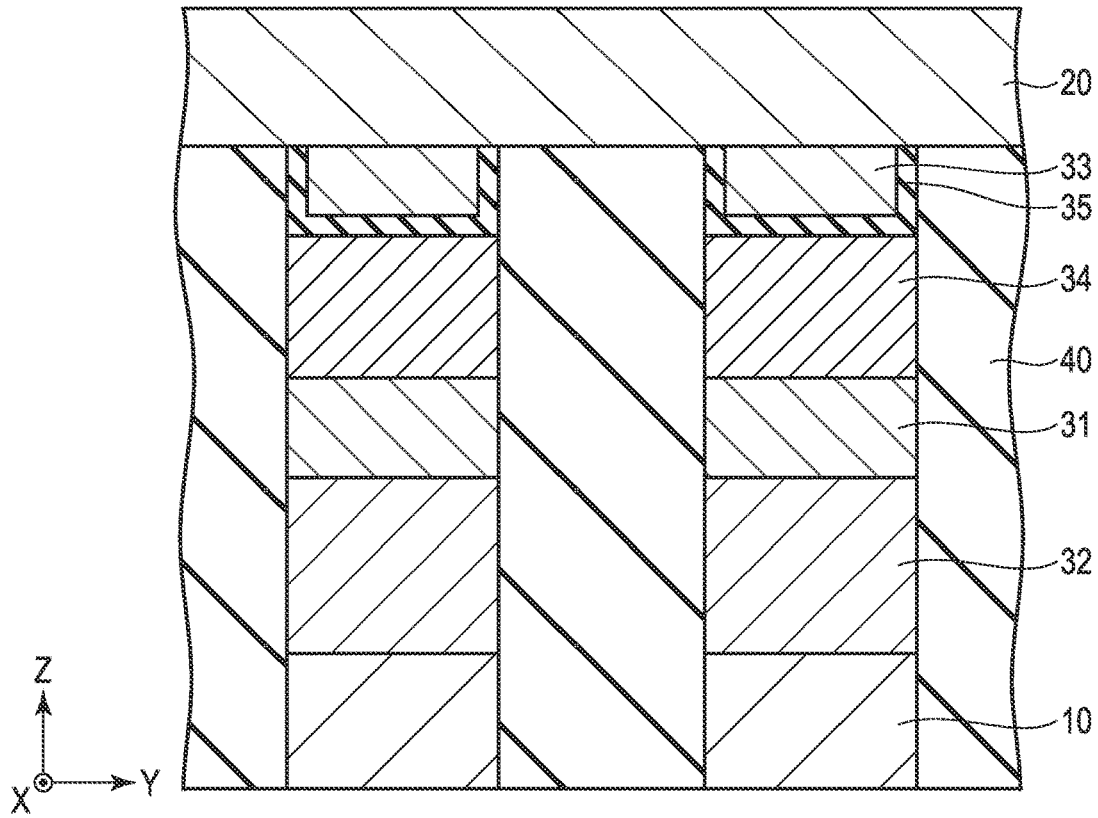

Next, as shown in FIG. 16C, each part of the tunnel barrier layer 35L formed on the top surface of each interlayer insulating layer 40 is removed, and a polysilicon layer is formed on each remaining part of the tunnel barrier layer 35L. Furthermore, by subjecting each polysilicon layer to ion implantation of an impurity element, a pn junction diode is formed at each part. Thereby, the resistance elements 33 and tunnel barrier elements 35 are obtained.

Next, as shown in FIG. 160, a pattern of the second wiring 20 is formed on the structure obtained in the process of FIG. 16C.

In the manner described above, a magnetic memory device including the first wiring 10, magnetoresistance effect elements 31, selectors 32, resistance elements 33, top electrodes 34, tunnel barrier elements 35, and second wiring 20 is obtained.

Third Embodiment

Next, a third embodiment will be described. It should be noted that the fundamental items are identical to the aforementioned first and second embodiments, and descriptions of the items described in the first and second embodiments are omitted.

FIG. 17 is a cross-sectional view schematically showing the configuration of a magnetic memory device according to this embodiment.

In this embodiment, third wiring 50 and a memory cell 60 are further provided in addition to the first wiring 10, second wiring 20, and memory cell 30 described in the first embodiment.

The third wiring 50 extends in a direction identical to the first wiring 10, i.e., in the X-direction. The first wiring 10 and third wiring 50 function as word lines, and second wiring 20 functions as bit lines.

The memory cell 60 is connected between the second wiring 20 and third wiring 50, includes a magnetoresistance effect element 61, selector (switching element) 62, resistance element 63, and top electrode 64, and stores therein data corresponding to the resistance state of the magnetoresistance effect element 61. The magnetoresistance effect element 61, selector 62, and resistance element 63 are connected in series. The fundamental configurations of the magnetoresistance effect element 61, selector 62, and resistance element 63 are identical to the configurations of the magnetoresistance effect element 31, selector 32, and resistance element 33.

However, in this embodiment, the word lines (first wiring 10, third wiring 50) are provided on both sides of the common bit line (second wiring 20). Accordingly, the directions of the resistance element (pn junction diode) 33 and resistance element (pn junction diode) 63 are opposite to each other. That is, when the direction from the first wiring 10 to the second wiring 20 corresponds to the forward direction of the resistance element 33, direction from the third wiring 50 to the second wiring 20 corresponds to the forward direction of the resistance element 63 and, when the direction from the first wiring 10 to the second wiring 20 corresponds to the reverse direction of the resistance element 33, direction from the third wiring 50 to the second wiring 20 corresponds to the reverse direction of the resistance element 63.

The fundamental write operation and read operation of the memory cell 60 are identical to the write operation and read operation of the memory cell 30.

In this embodiment too, as in the case of the first embodiment, it is possible to reduce the read current and suppress the occurrence of read disturb and increase in the power consumption.

FIG. 18 is a cross-sectional view schematically showing the configuration of a magnetic memory device according to a modified example of this embodiment.

In this modified example, as in the case of the second embodiment, the memory cell 30 includes a tunnel barrier element 35, and magnetoresistance effect element 31, selector 32, resistance element 33, and tunnel barrier element 35 are connected in series. Further, the memory cell 60 includes a tunnel barrier element 65, and magnetoresistance effect element 61, selector 62, resistance element 63, and tunnel barrier element 65 are connected in series. The fundamental configuration and fundamental characteristic of the tunnel barrier element 65 are identical to the tunnel barrier element 35 described in the second embodiment.

In this modified example, the memory elements 30 and 60 are respectively provided with the tunnel barrier elements 35 and 65. Accordingly, it is possible to obtain advantageous effects identical to the advantageous effects described in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a first wiring extending in a first direction;
a second wiring extending in a second direction intersecting the first direction; and
a first memory cell connected between the first wiring and the second wiring, the first memory cell including a first magnetoresistance effect element having a low resistance state and a high resistance state, a first switching element, and a first resistance element which are connected in series, and the first memory cell storing data corresponding to a resistance state of the first magnetoresistance effect element,
wherein:
the first resistance element has a current-voltage characteristic asymmetric with respect to a case where a voltage in a forward direction is applied thereto and a case where a voltage in a reverse direction is applied thereto, and
when the data corresponding to the resistance state of the first magnetoresistance effect element is read from the first memory cell, a first voltage in the reverse direction is applied to the first resistance element, and a resistance value of the first resistance element at a time when the first voltage in the reverse direction is applied thereto is greater than a resistance value of the first resistance element at a time when a second voltage in the forward direction having an absolute value identical to an absolute value of the first voltage is applied thereto.

2. The device of claim 1, wherein the resistance value of the first resistance element at the time when the first voltage in the reverse direction is applied thereto is less than a resistance value of the first magnetoresistance effect element in the low resistance state.

3. The device of claim 1, wherein the resistance value of the first resistance element at the time when the first voltage in the reverse direction is applied thereto is greater than a resistance value of the first switching element in an on-state and is less than a resistance value of the first switching element in an off-state.

4. The device of claim 1, wherein the first resistance element is a diode.

5. The device of claim 1, wherein the first switching element has a characteristic in a current sweep such that when a voltage applied between terminals thereof increases to reach a threshold voltage, the first switching element makes a transition from an off-state to an on-state and, when a voltage applied between the terminals thereof decreases to reach a hold voltage lower than the threshold voltage, the first switching element makes a transition from the on-state to the off-state.

6. The device of claim 1, wherein the first memory cell further includes a first tunnel barrier element connected in series to the first magnetoresistance effect element, the first switching element, and the first resistance element, the first tunnel barrier element having a nonlinear current-voltage characteristic.

7. The device of claim 1, wherein the first magnetoresistance effect element includes a first magnetic layer having a variable magnetization direction, a second magnetic layer having a fixed magnetization direction, and a nonmagnetic layer provided between the first magnetic layer and the second magnetic layer.

8. The device of claim 1, wherein;
the resistance state of the first magnetoresistance effect element is set according to a direction of a current flowing through the first magnetoresistance effect element, and
a direction of a current flowing through the first magnetoresistance effect element when the data corresponding to the resistance state of the first magnetoresistance effect element is read from the first memory cell is identical to a direction of a current flowing through the first magnetoresistance effect element when the low resistance state is set to the first magnetoresistance effect element.

9. The device of claim 1, wherein the first switching element and the first resistance element are adjacent to each other.

10. The device of claim 1, wherein the first switching element is provided between the first magnetoresistance effect element and the first resistance element.

11. The device of claim 1, wherein the first resistance element is provided between the first magnetoresistance effect element and the first switching element.

12. The device of claim 1, wherein the first magnetoresistance effect element is provided between the first switching element and the first resistance element.

13. The device of claim 1, further comprising:
a third wiring extending in the first direction;
a second memory cell connected between the second wiring and the third wiring, the second memory cell including a second magnetoresistance effect element having a low resistance state and a high resistance state, a second switching element, and a second resistance element which are connected in series, and the second memory cell storing data corresponding to a resistance state of the second magnetoresistance effect element,
wherein:
the second resistance element has a current-voltage characteristic asymmetric with respect to a case where a voltage in a forward direction is applied thereto and a case where a voltage in a reverse direction is applied thereto, and
when the data corresponding to the resistance state of the second magnetoresistance effect element is read from the second memory cell, a third voltage in the reverse direction is applied to the second resistance element, and a resistance value of the second resistance element at a time when the third voltage in the reverse direction is applied thereto is greater than a resistance value of the second resistance element at a time when a fourth voltage in the forward direction having an absolute value identical to an absolute value of the third voltage is applied thereto.

* * * * *